United States Patent
Tanikawa

(10) Patent No.: US 11,257,691 B2
(45) Date of Patent: *Feb. 22, 2022

(54) SUBSTRATE PROCESSING APPARATUS

(71) Applicant: Tokyo Electron Limited, Tokyo (JP)

(72) Inventor: Takehiro Tanikawa, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 182 days.

This patent is subject to a terminal disclaimer.

(21) Appl. No.: 16/394,320

(22) Filed: Apr. 25, 2019

(65) Prior Publication Data
US 2019/0333785 A1 Oct. 31, 2019

(30) Foreign Application Priority Data
Apr. 27, 2018 (JP) .............................. JP2018-087467

(51) Int. Cl.
*H01L 21/67* (2006.01)
*H01J 37/32* (2006.01)
*H01L 21/687* (2006.01)
*H01R 13/24* (2006.01)

(52) U.S. Cl.
CPC .. *H01L 21/67069* (2013.01); *H01J 37/32091* (2013.01); *H01J 37/32642* (2013.01); *H01L 21/68735* (2013.01); *H01J 2237/334* (2013.01); *H01R 13/2421* (2013.01)

(58) Field of Classification Search
CPC .......... H01L 21/68735; H01L 21/67069; H01J 37/32091; H01J 2237/334
See application file for complete search history.

(56) References Cited

U.S. PATENT DOCUMENTS

| 5,304,248 A | 4/1994 | Cheng et al. |
| 2004/0129226 A1* | 7/2004 | Strang ............... H01L 21/67069 |
| | | 118/728 |
| 2008/0236749 A1* | 10/2008 | Koshimizu ....... H01J 37/32165 |
| | | 156/345.33 |
| 2009/0071938 A1 | 3/2009 | Dhindsa et al. |
| 2010/0147681 A1* | 6/2010 | Li ........................... H01J 37/34 |
| | | 204/298.08 |
| 2010/0294433 A1 | 11/2010 | Jianhui |

(Continued)

FOREIGN PATENT DOCUMENTS

| JP | 2008-244274 | 10/2008 |
| JP | 2009-044075 | 2/2009 |

OTHER PUBLICATIONS

Johantgen, Speed-Torque Curves for Stepper Motors, Sep. 2, 2017 (Year: 2017).

(Continued)

*Primary Examiner* — Keath T Chen
*Assistant Examiner* — Margaret D Klunk
(74) *Attorney, Agent, or Firm* — IPUSA, PLLC

(57) ABSTRACT

There is provision of a substrate processing apparatus including an inner edge ring provided in a vicinity of a substrate to be placed on a stage in a processing chamber; a middle edge ring arranged outside the inner edge ring, the middle edge ring being configured to be moved vertically by an actuation mechanism; an outer edge ring arranged outside the middle edge ring; a first spring provided between the inner edge ring and the middle edge ring; and a second spring provided between the middle edge ring and the outer edge ring.

15 Claims, 12 Drawing Sheets

(a-1) Down (a-2) Up

(56) References Cited

U.S. PATENT DOCUMENTS

| | | | |
|---|---|---|---|
| 2011/0100553 A1 | 5/2011 | Dhindsa et al. | |
| 2012/0175063 A1 | 7/2012 | Yamawaku et al. | |
| 2014/0017900 A1* | 1/2014 | Doha | H01L 21/68735 |
| | | | 438/710 |
| 2014/0262026 A1 | 9/2014 | Forster et al. | |
| 2014/0262763 A1* | 9/2014 | Rasheed | H01J 37/32651 |
| | | | 204/298.07 |
| 2014/0273483 A1* | 9/2014 | Ge | H01J 37/32651 |
| | | | 438/710 |
| 2016/0211166 A1* | 7/2016 | Yan | H01J 37/023 |
| 2017/0213758 A1 | 7/2017 | Rice et al. | |
| 2018/0277416 A1* | 9/2018 | Takahashi | H01L 21/68735 |
| 2018/0315640 A1* | 11/2018 | Ueda | H01J 37/32642 |
| 2018/0358211 A1* | 12/2018 | Mun | H01L 21/68735 |
| 2019/0326092 A1* | 10/2019 | Ogasawara | H01J 37/32091 |

OTHER PUBLICATIONS

ASM International Handbook Committee (1998). ASM Handbook, vol. 07—Powder Metal Technologies and Applications. ASM International (Year: 1998).

O'Mara, W.C. Herring, R.B. Hunt, L.P..(1990). Handbook of Semiconductor Silicon Technology—6.5.7 Other Physical and Thermodynamic Properties. William Andrew Publishing/Noyes (Year: 1990).

* cited by examiner

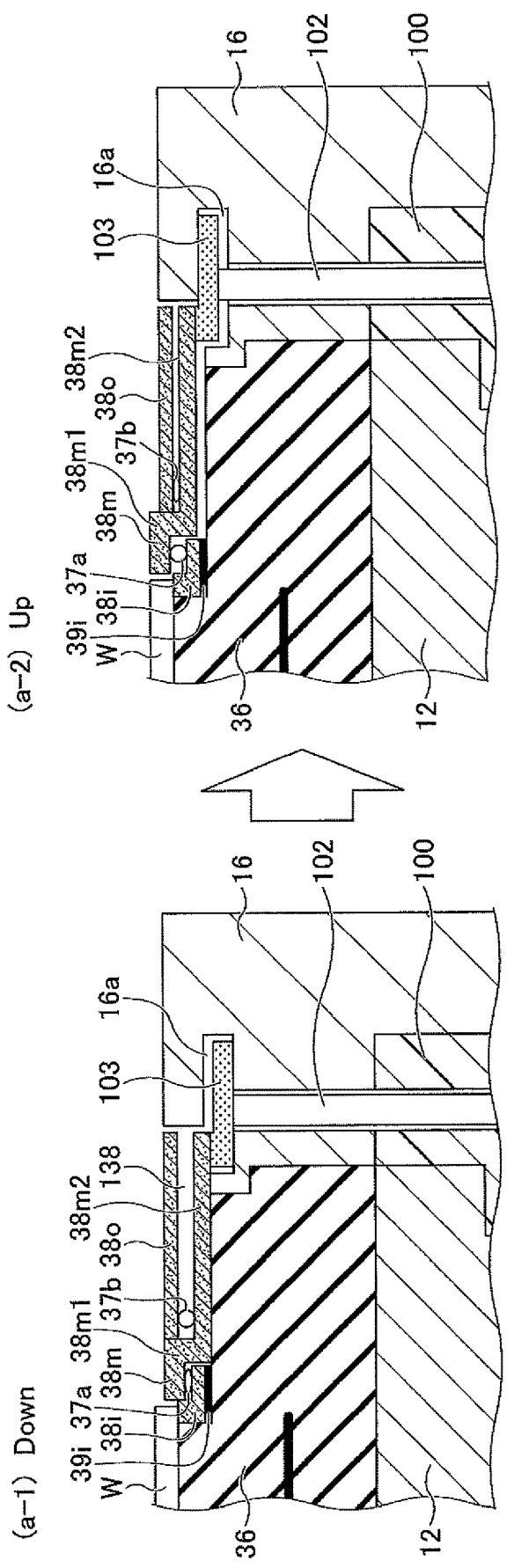

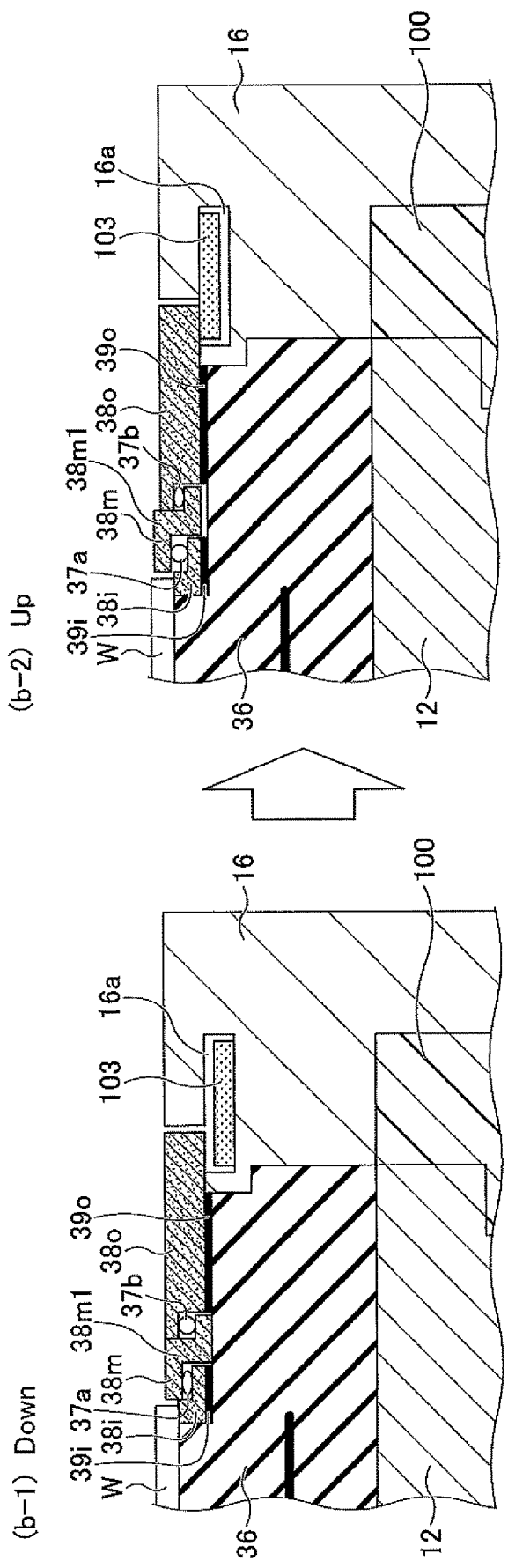

SUBSTRATE PROCESSING APPARATUS

CROSS-REFERENCE TO RELATED APPLICATIONS

This patent application is based on and claims priority to Japanese Patent Application No. 2018-087467 filed on Apr. 27, 2018, the entire contents of which are incorporated herein by reference.

TECHNICAL FIELD

The present disclosure relates to a substrate processing apparatus.

BACKGROUND

In a plasma etching apparatus, an edge ring is provided around an outer circumference of a wafer (see Patent Document 1, for example). The edge ring controls plasma in a vicinity of the outer circumference of the wafer, and improves uniformity of an etching rate on a surface of the wafer.

CITATION LIST

Patent Document

[Patent Document 1] Japanese Laid-open Patent Application Publication No. 2008-244274

SUMMARY

The present disclosure aims at providing a technique for securing thermal contact and electrical contact of separated edge rings.

According to an aspect of the present disclosure, there is provision of a substrate processing apparatus including an inner edge ring provided in a vicinity of a substrate to be placed on a stage in a processing chamber; a middle edge ring arranged outside the inner edge ring, the middle edge ring being configured to be moved vertically by an actuation mechanism; an outer edge ring arranged outside the middle edge ring; a first spring provided between the inner edge ring and the middle edge ring; and a second spring provided between the middle edge ring and the outer edge ring.

BRIEF DESCRIPTION OF THE DRAWINGS

FIGS. 5A and 5B are diagrams illustrating contacting members of an edge ring according to Example 1;

DETAILED DESCRIPTION OF EMBODIMENTS

In the following, embodiments of the present disclosure will be described with reference to the drawings. Note that in the following descriptions and the drawings, elements having substantially identical features are given the same reference symbols and overlapping descriptions may be omitted.

[Substrate Processing Apparatus]

Figure 1:
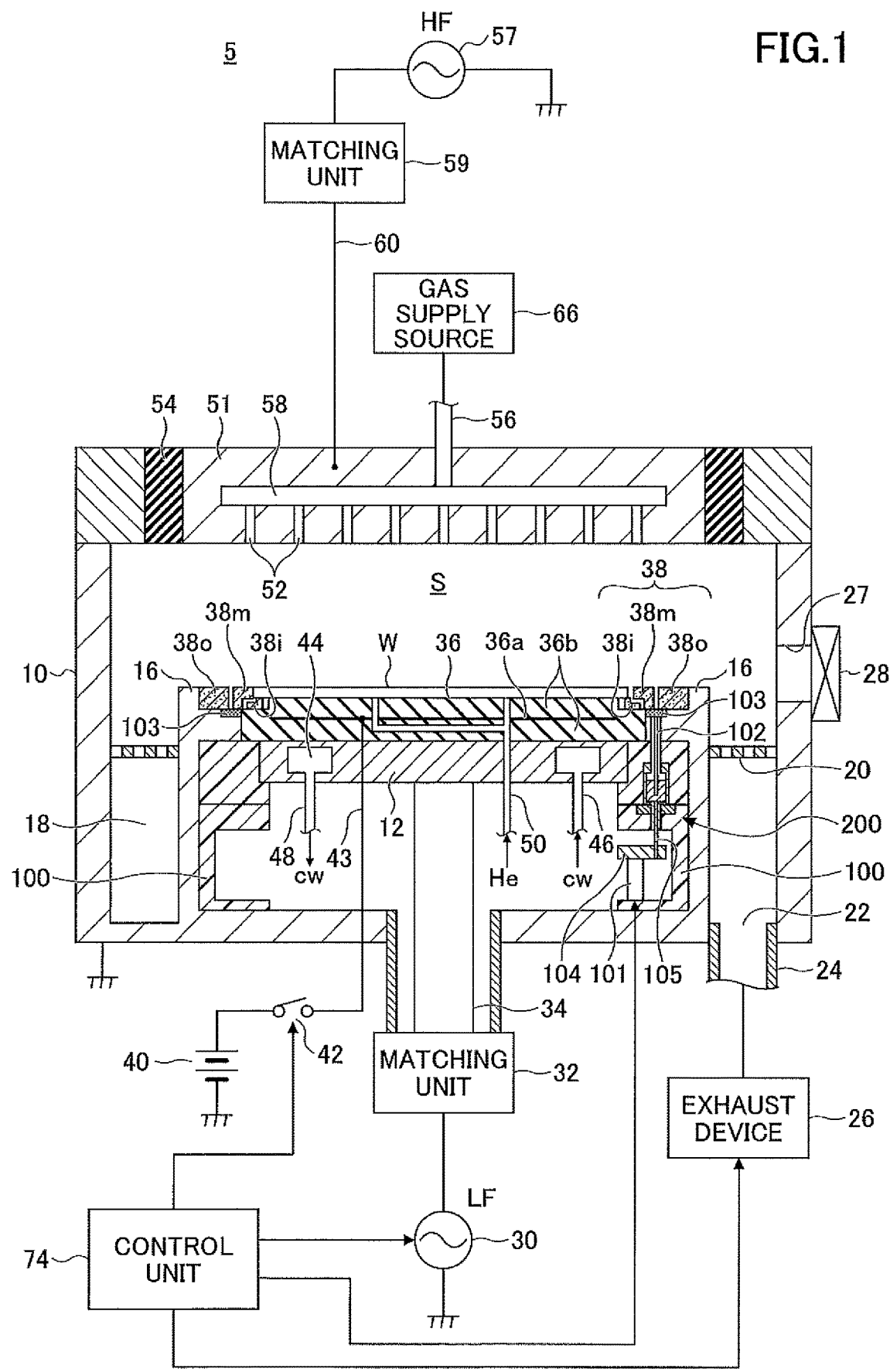
FIG. 1 is a diagram illustrating an example of a substrate processing apparatus according to an embodiment.

First, an example of a substrate processing apparatus 5 according to an embodiment will be described with reference to FIG. 1. FIG. 1 is a diagram illustrating a structure of the substrate processing apparatus 5 according to the embodiment. The present embodiment describes a case in which the substrate processing apparatus 5 is a capacitively coupled plasma type parallel-flat plate substrate processing apparatus.

The substrate processing apparatus 5 includes a chamber 10 which is a cylindrical vacuum vessel made from metal such as aluminum or stainless steel. The chamber 10 is an example of a processing vessel. An inside of the chamber 10 is a processing chamber for performing a plasma process. The chamber 10 is grounded.

A disc shaped stage 12 is provided at a center of a lower portion in the chamber 10. The stage 12 is a base for holding a substrate, and the stage 12 also acts as a lower electrode. The stage 12 is made from aluminum, for example. The stage 12 is supported by a cylindrical conductive supporting member 16 that extends upward from the bottom of the chamber 10, and by a housing 100 adjacently provided at an inside of the cylindrical conductive supporting member 16.

Between the cylindrical conductive supporting member 16 and a side wall of the chamber 10, an annular exhaust path 18 is formed. At an upper portion or an entrance of the exhaust path 18, an annular baffle plate 20 is provided. At a bottom of the exhaust path 18, at least one exhaust port 22 is provided. In order to make gas flow in the chamber 10 axially symmetrical with a central axis of a wafer W on the stage 12, it is preferable that multiple exhaust ports 22 are provided at regular intervals in a circumferential direction.

An exhaust device 26 is connected to each of the exhaust ports 22 via an exhaust pipe 24. The exhaust device 26 includes a vacuum pump such as a turbomolecular pump, and can reduce pressure of a plasma generating space S in the chamber 10 to a desirable quality of vacuum. Further, a gate valve 28 is provided at the side wall of the chamber 10, which is used for opening and/or closing a loading/unloading port 27 for a wafer W.

A second high frequency power source 30 is electrically connected to the stage 12 via a matching unit 32 and a feeder 34. The second high frequency power source 30 supplies high frequency electric power LF of a first frequency (such as a radio frequency at 13.56 MHz) suitable for controlling energy of ions to be attracted to a wafer W. The high frequency electric power LF output from the second high frequency power source 30 is variable. The matching unit 32 includes a variable reactance matching circuit to cause impedance of the second high frequency power source 30 to match impedance of a load (plasma and the like).

The stage 12 includes an electrostatic chuck 36 for holding a wafer W by using electrostatic force. The electrostatic chuck 36 is provided on an upper surface of the stage 12. The electrostatic chuck 36 is made by sandwiching an electrode 36a formed of a conductive film between a pair of insulating films 36b. A direct-current (DC) power source 40 is electrically connected to the electrode 36a via a switch 42 and a coated wire 43. The electrostatic chuck 36 generates electrostatic force by DC voltage supplied from the DC power source 40, and a wafer W is attracted to and held by the electrostatic chuck 36 by the generated electrostatic force.

In the stage 12, an annular coolant passage 44 extending, for example, in a circumferential direction is provided. From a chiller unit, coolant such as cooling water cw is supplied to the coolant passage 44 at a predetermined temperature, and the coolant circulates in the coolant passage 44 via pipes 46 and 48, in order to control a temperature of a wafer W placed on the electrostatic chuck 36 by a temperature of the coolant. A heater may also be provided in the stage 12.

Further, heat transmitting gas (such as He gas) is supplied to a space between an upper surface of the electrostatic chuck 36 and a bottom surface of the wafer W, from a heat transmitting gas supply unit via a gas supply pipe 50. Also, a pusher pin capable of moving up and down, and an elevation mechanism for the pusher pin, are provided at the stage 12. The pusher pin is used for loading and unloading a wafer. The pusher pin is provided so as to penetrate the stage in a vertical direction.

A shower head 51 is mounted at a ceiling of the chamber 10 via a shield ring 54 covering a periphery of the shower head 51, such that an opening of the ceiling of the chamber 10 is closed with the shower head 51. The shower head 51 may be formed of aluminum or silicon. The shower head 51 also acts as an upper electrode facing the stage 12 acting as the lower electrode.

A gas inlet 56 for introducing gas is formed at the shower head 51. Inside the shower head 51, a diffusion chamber 58 branching from the gas inlet 56 is provided. Gas output from a gas supply source 66 is supplied to the diffusion chamber 58 via the gas inlet 56, and diffuses in the diffusion chamber 58. Then the gas is introduced from the large number of gas holes 52 to the plasma generating space S.

A first high frequency power source 57 is electrically connected to the shower head 51 via a matching unit 59 and a feeder 60. The first high frequency power source 57 outputs high frequency electric power HF of a second frequency (such as a radio frequency at 40 MHz) higher than the first frequency, which is suitable for generating plasma by high frequency discharge. The first high frequency power source 57 can output the high frequency electric power HF by a variable amount. The matching unit 59 includes a variable reactance matching circuit to cause impedance of the first high frequency power source 57 to match impedance of a load (plasma and the like).

A control unit 74 includes a microcomputer for example, and controls operations of each component of the substrate processing apparatus 5 and an operation of the entirety of the substrate processing apparatus 5. Examples of the components in the substrate processing apparatus 5 include the exhaust device 26, the first high frequency power source 57, the second high frequency power source 30, the matching unit 32, the matching unit 59, the switch 42 for the electrostatic chuck, the gas supply source 66, the chiller unit, and the heat transmitting gas supply unit.

When a process such as etching is performed in the substrate processing apparatus 5, the gate valve 28 is opened first, and a wafer W is loaded into the chamber 10, and the wafer W is placed on the electrostatic chuck 36. Subsequently, after the gate valve 28 is closed, a predetermined gas is introduced from the gas supply source 66 to the chamber 10, at a predetermined flow rate or a flow ratio of gases, and pressure in the chamber 10 is reduced to a predetermined value by the exhaust device 26. Further, the first high frequency power source 57 is turned on to output the high frequency electric power HF for generating plasma at predetermined magnitude, and to supply the high frequency electric power HF to the shower head 51 via the matching unit 59 and the feeder 60.

When the high frequency electric power LF for attracting ions is applied, the second high frequency power source 30 is turned on to output the high frequency electric power LF at predetermined magnitude, and to supply the high frequency electric power LF to the stage 12 via the matching unit 32 and the feeder 34. Further, heat transmitting gas is supplied to a contacting surface between the electrostatic chuck 36 and the wafer W, from the heat transmitting gas supply unit. In addition, the switch 42 is turned on, to apply DC voltage to the electrode 36a of the electrostatic chuck 36, and to enclose the heat transmitting gas at the contacting surface by electrostatic force between the wafer W and the electrostatic chuck 36.

[3-Piece Edge Ring]

An edge ring 38 is disposed at an outer circumference of the stage 12 so as to annularly surround a periphery of a wafer W placed on the stage 12. The edge ring 38 is arranged in a vicinity of the wafer W. The edge ring 38 controls plasma at the outer circumference of the wafer W, and improves uniformity of a process such as etching on a surface of the wafer W.

The edge ring 38 includes three separated rings, an inner edge ring 38i, a middle edge ring 38m, and an outer edge ring 38o. The inner edge ring 38i is arranged in the vicinity of the wafer W placed on the stage 12 in the chamber 10. The middle edge ring 38m is provided outside the inner edge ring 38i, and can be moved vertically (up and down) by an actuation mechanism 200. The outer edge ring 38o is provided outside the middle edge ring 38m.

The actuation mechanism 200 includes a lift pin 102. The lift pin 102 is moved vertically by a driving force of a piezo actuator 101 via a member 104 (104a) and a bushing 105. In accordance with movement of the lift pin 102, a connecting member 103 moves vertically, and thereby the middle edge ring 38m connected to the connecting member 103 moves vertically.

(Edge Ring Structure)

Next, a structure of the edge ring 38 and its peripheral parts will be described with reference to FIG. 2 and FIGS. 3A to 3D. Also, vertical movement of the middle edge ring 38m will be described with reference to FIGS. 4A and 4B.

Figure 2:
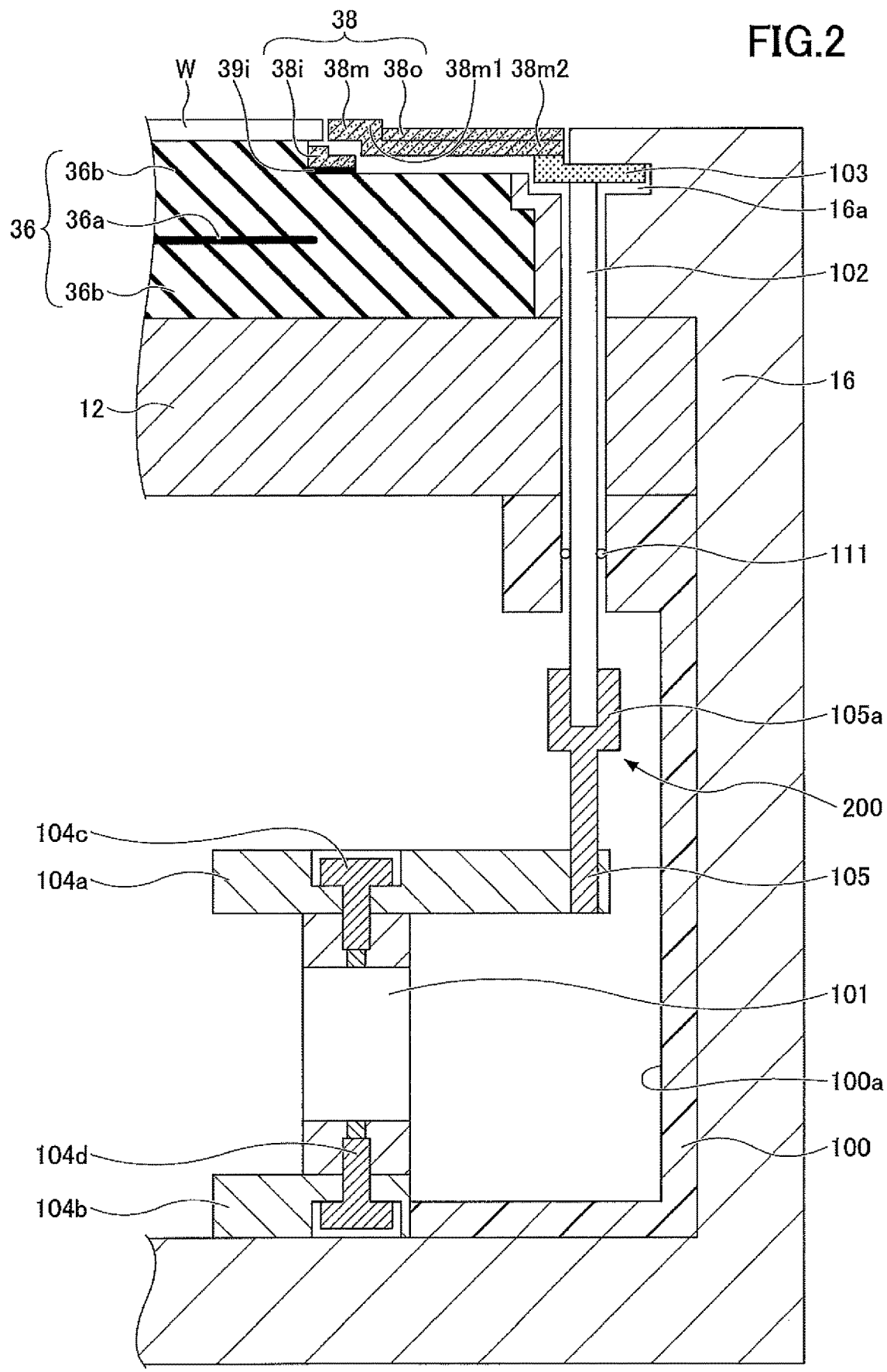
FIG. 2 is a diagram illustrating a structure of an edge ring and its vicinity according to the embodiment.

FIG. 2 is an enlarged view of a vertical cross section of an example of the edge ring 38 and its vicinity according to the present embodiment. In FIG. 2, the edge ring 38 according to the present embodiment, the actuation mechanism 200, and the piezo actuator 101 are illustrated.

Figure 3A:
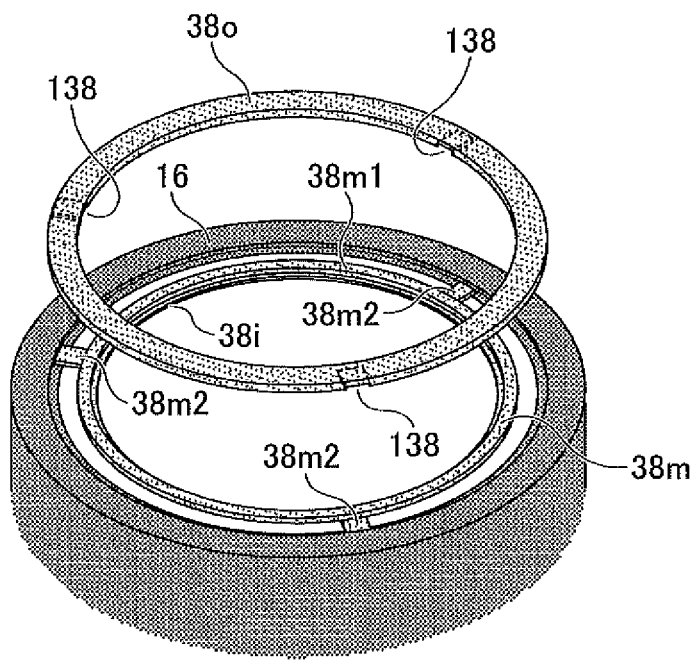
FIG. 3A is a perspective view of the edge ring according to the embodiment.
Figure 3B:
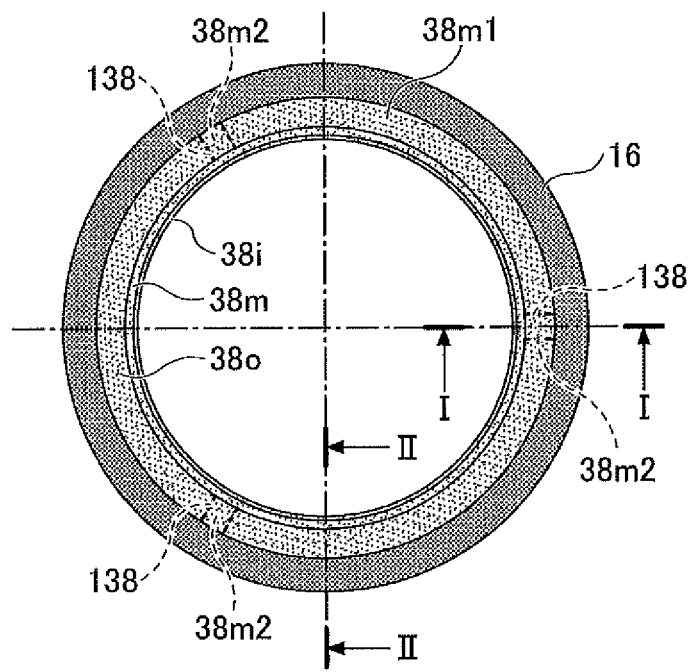
FIG. 3B is a plan view of the edge ring according to the embodiment.
Figure 3C:
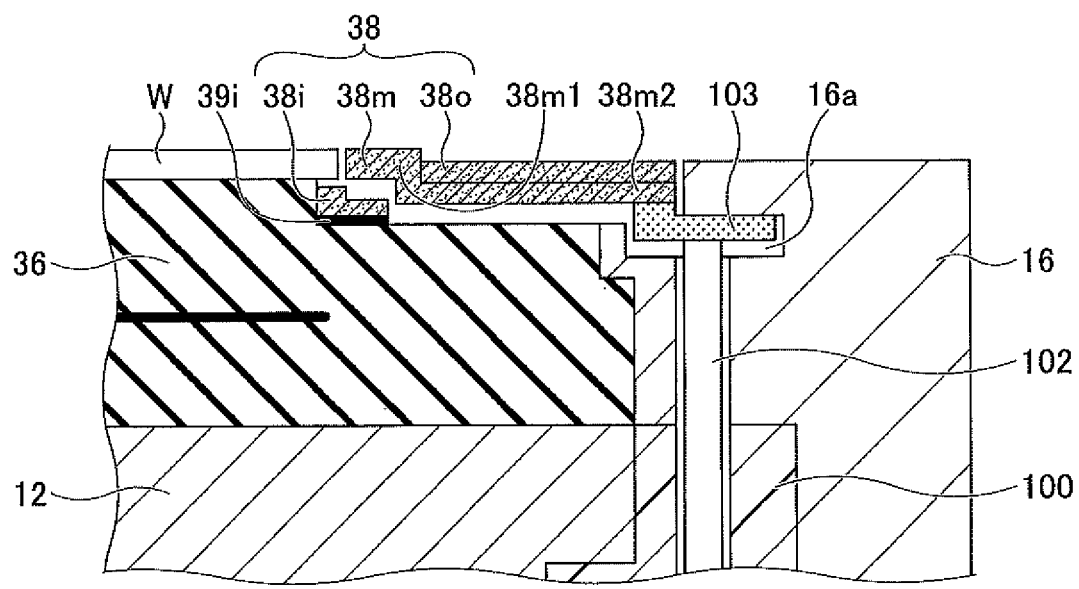
FIGS. 3C to 3D are cross-sectional views of the edge ring according to the embodiment.
Figure 3D:
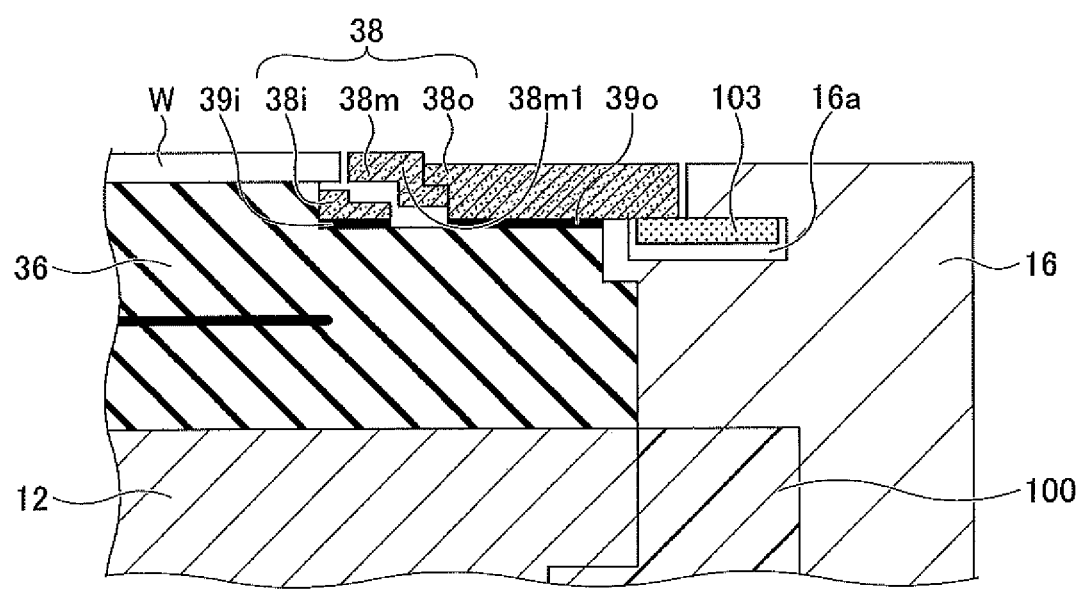

FIG. 3A illustrates a perspective view of each of the pieces of the edge ring 38, FIG. 3B is a plan view of each of the three separated rings of the edge ring 38, FIG. 3C is a cross sectional view taken along a line I-I in FIG. 3B, and FIG. 3D illustrates a cross sectional view taken along a line II-II in FIG. 3B.

As illustrated in FIG. 2 and FIGS. 3A to 3D, the inner edge ring 38i is an innermost member of the edge ring 38, which is provided in the vicinity of an outer circumference of a wafer W so as to surround the wafer W below the wafer W. The middle edge ring 38m is a member provided outside the inner edge ring 38i so as to surround the inner edge ring 38i. The outer edge ring 38o is an outermost member of the edge ring 38, which is provided outside the middle edge ring 38*m*. The inner edge ring 38*i* and the outer edge ring 38*o* are fixed on the upper surface of the electrostatic chuck 36, via a heat transfer sheet 39*i* and a heat transfer sheet 39*o* respectively. The middle edge ring 38*m* is configured to be movable vertically by the actuation mechanism 200.

As illustrated in FIG. 3A and FIG. 3B, the middle edge ring 38*m* includes a ring portion 38*m*1 surrounding a periphery of the wafer W, and three tabs 38*m*2. The tabs 38*m*2 are rectangular members projecting outward from the ring portion 38*m*1, and are arranged at an outer circumference of the ring portion 38*m*1 at regular intervals. As illustrated in FIG. 2, a vertical cross section (a cross section taken along the vertical direction) of the ring portion 38*m*1 is of an L-shape. In a case in which the middle edge ring 38*m* is moved upward from a state in which an L-shaped step of the ring portion 38*m*1 is in contact with a step of the inner edge ring 38*i* having an L-shaped vertical cross section, the step of the ring portion 38*m*1 is apart from the step of the inner edge ring 38*i*.

(Actuation Mechanism and Actuating Unit)

The tab 38*m*2 of the middle edge ring 38*m* is connected to the annular connecting member 103. The connecting member 103 vertically moves in a space 16*a* provided in the cylindrical conductive supporting member 16.

The actuation mechanism 200 is for moving the middle edge ring 38*m* vertically, and includes the lift pin 102 and the bushing 105. The actuation mechanism 200 is fitted to the housing 100 provided around the stage 12, and is configured to be moved vertically by the driving force of the piezo actuator 101 attached to the housing 100. The lift pin 102 may be formed of sapphire.

The housing 100 is made from insulating material such as alumina. The housing 100 is adjacently provided inside the cylindrical conductive supporting member 16 such that a side surface and a bottom surface of the housing 100 touch the cylindrical conductive supporting member 16. The actuation mechanism 200 is provided in the housing 100. The lift pin 102 penetrates the housing 100 and the stage 12, and is in contact with a bottom surface of the connecting member 103 in the space 16*a* provided in the cylindrical conductive supporting member 16. The bushing 105 is fitted to the member 104*a* provided inside the housing 100. In a hole for the lift pin 102, an 0 ring 111 for separating vacuum space from atmosphere is provided.

To a recess 105*a* provided at a tip of the bushing 105, a bottom end of the lift pin 102 is fitted from above. When the bushing 105 moves vertically via the member 104*a* by a positioning operation of the piezo actuator 101, the lift pin 102 moves vertically, and the lift pin 102 pushes the bottom surface of the connecting member 103 upward, or pulls the bottom surface of the connecting member 103 downward. Accordingly, the middle edge ring 38*m* moves vertically via the connecting member 103.

An upper end of the piezo actuator 101 is bolted to the member 104*a* with a screw 104*c*, and a bottom end of the piezo actuator 101 is bolted to a member 104*b* with a screw 104*d*. Accordingly, the piezo actuator 101 is fixed to the housing 100 between the member 104*a* and the member 104*b*.

The piezo actuator 101 is an element for positioning, which utilizes piezoelectric effect, and can perform positioning at a resolution of 0.006 mm (6 μm). The lift pin 102 moves vertically in accordance with an amount of vertical displacement of the piezo actuator 101. Accordingly, the middle edge ring 38*m* moves vertically by 0.006 mm unit at minimum.

For each of the three tabs 38*m*2 arranged on the circumference of the ring portion 38*m*1 at regular intervals in the circumferential direction, the corresponding lift pin 102 is provided. Accordingly, the lift pins 102 push the middle edge ring 38*m* upward at three points, via the annular connecting member 103, and the middle edge ring 38*m* is raised to a desired height.

On a bottom surface of the outer edge ring 38*o*, recesses 138 are formed at locations corresponding to the tabs 38*m*2 of the middle edge ring 38*m*. The recess 138 is wider than the tab 38*m*2. When the lift pins 102 push the middle edge ring 38*m* upward and the middle edge ring 38*m* is raised to its maximum level, the tabs 38*m*2 are stored into the recesses 138. Accordingly, the middle edge ring 38*m* can be moved upward while the outer edge ring 38*o* is fixed.

In FIG. 3D, which illustrates the cross sectional view taken along the line II-II in FIG. 3B, the lift pin 102 and the recess 138 are not present. FIG. 3D illustrates a state in which the annular connecting member 103 is raised upward in the space 16*a* of the cylindrical conductive supporting member 16 because the lift pin 102 has moved upward.

Referring back to FIG. 2, for each of the lift pins 102, the corresponding piezo actuator 101 is provided in a space of the housing 100 below the lift pin 102. That is, three actuation mechanisms 200 and the three piezo actuators 101, which correspond to the lift pins 102 disposed at three locations respectively, are provided in the housing 100. The member 104*a* and the member 104*b* are annular members, and the member 104*b* is positioned below the member 104*a*. The three piezo actuators 101 are disposed between the members 104*a* and 104*b*, and bolted on the members 104*a* and 104*b*. Thus, the three piezo actuators 101 are connected with each other via the members 104*a* and 104*b*. Note that the piezo actuator 101 according to the present embodiment is an example of an actuating unit.

According to the structure described above, the stage 12 (including the electrostatic chuck 36) is supported by the housing 100, and the actuation mechanisms 200 and the actuating units are fitted to the housing 100. Accordingly, only the middle edge ring 38*m* can be moved vertically by using the existing electrostatic chuck 36, without requiring a design modification of the electrostatic chuck 36.

Also, in the present embodiment, because a predetermined space is provided between the upper surface of the electrostatic chuck 36 and the bottom surface of the middle edge ring 38*m* as illustrated in FIG. 2, the middle edge ring 38*m* can be moved to not only an upward direction but also a downward direction. Accordingly, the middle edge ring 38*m* can be moved in the predetermined space to not only an upward direction but also a downward direction by a predetermined amount. Because the middle edge ring 38*m* can be moved to not only an upward direction but also a downward direction, a range of controlling a sheath can be extended.

However, an actuating unit is not limited to the piezo actuators 101, and a motor capable of performing positioning control at a resolution of 0.006 mm may be used as an actuating unit. Also, the number of actuating units may be one, or more than one. Further, a motor for vertically moving a pusher pin used for raising a wafer W may be used as an actuating unit for moving the middle edge ring 38*m*. In this case, a mechanism, such as a gear or a driving force switching unit, for switching a destination of transmitting a driving force of the motor between the pusher pin used for raising a wafer W and the lift pin 102 for the middle edge ring 38*m*, is required. Also, a mechanism for controlling vertical movement of the lift pin 102 at a resolution of 0.006 mm is required. However, as a diameter of the middle edge ring 38m arranged around an outer circumference of a 300 mm wafer W is large, approximately 310 mm, an actuating unit for the lift pin 102 and an actuating unit for the pusher pin used for raising a wafer W are preferably separate.

The control unit 74 may control positioning of the piezo actuators 101 such that a vertical displacement amount of the piezo actuators 101 is in accordance with amount of abrasion of the middle edge ring 38m. Alternatively, the control unit 74 may determine a vertical displacement amount of the piezo actuators 101 in accordance with a process condition, regardless of amount of abrasion of the middle edge ring 38m.

In a case in which an upper surface of a wafer W and an upper surface of the edge ring 38 are at the same level, a height of a sheath on the wafer W and a height of a sheath on the edge ring 38 during an etching process can become the same. By the height of the sheath being the same at both locations, uniformity of an etching rate on a surface of a wafer W can be improved.

Figure 4A:
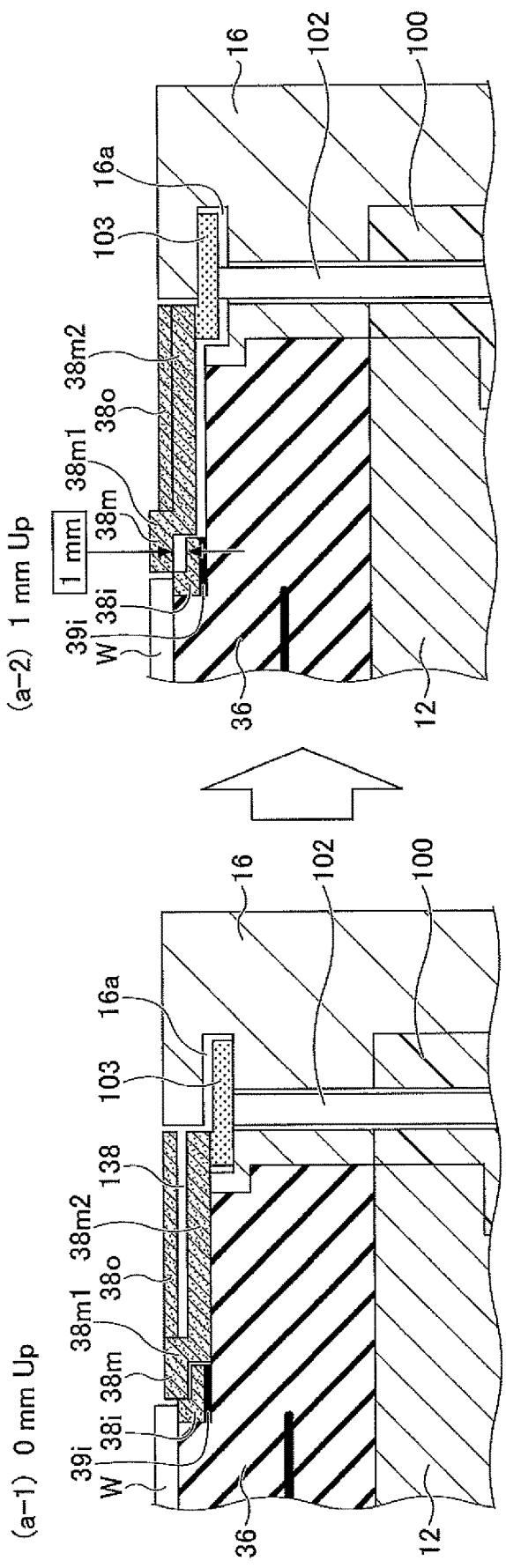
FIGS. 4A and 4B are diagrams illustrating vertical movement of the edge ring according to the embodiment.
Figure 4B:
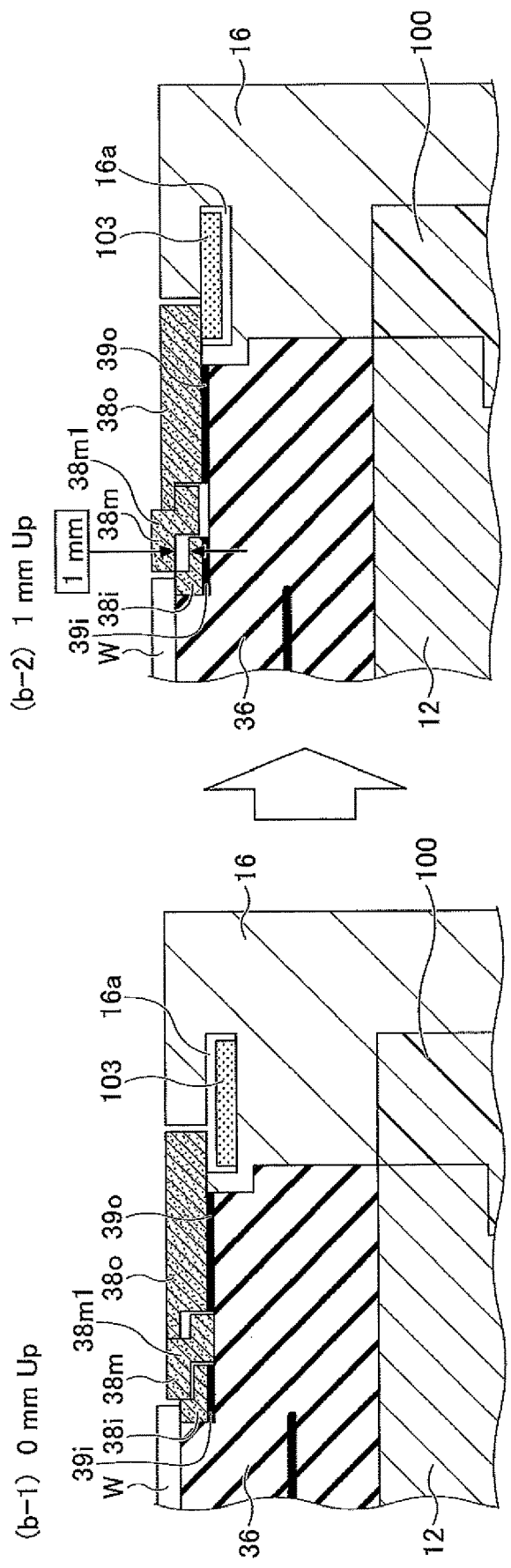

In a case in which a brand-new edge ring 38 is used, because a height of a sheath on the wafer W during an etching process and a height of a sheath on the edge ring 38 are the same, an etching rate on a surface of the wafer W becomes uniform. In this case, as illustrated in a diagram (a-1) of FIG. 4A, the middle edge ring 38m is not moved upward (0 mm) by the lift pins 102. Note that diagrams in FIG. 4A illustrate a state of a cross section of the edge ring 38 taken along a line I-I in FIG. 3B, and diagrams in FIG. 4B illustrate a state of a cross section of the edge ring 38 taken along a line II-II in FIG. 3B.

However, when the edge ring 38 is abraded by a plasma process such as etching, a height of the sheath on the edge ring 38 becomes lower than a height of the sheath on the wafer W. In this case, an etching rate at an edge portion of the wafer W may increase sharply, or tilting may occur in an etching profile. The tilting in an etching profile means a phenomenon in which a sheath on an edge portion of a wafer W inclines because of abrasion of an edge ring, in which ions are introduced to the wafer W from an oblique direction, and in which an etching profile becomes not vertical but slanted. Note that, in the present embodiment, an edge portion on a wafer W refers to a ring-shaped region on the wafer W, which is 140 mm to 150 mm away from a center of the wafer W in a radial direction.

Thus, in the present embodiment, the middle edge ring 38m is raised by an amount corresponding to amount of abrasion of the edge ring 38, to align a height of the sheath on the wafer W and a height of the sheath on the edge ring 38. Accordingly, occurrence of a sharp increase of an etching rate at the edge portion of the wafer W, or tilting in the etching profile can be avoided.

For example, in a case in which amount of abrasion of the middle edge ring 38m is 1.0 mm, the piezo actuator 101 may be controlled such that the middle edge ring 38m is moved upward by 1.0 mm. As a result, as illustrated in the diagram (a-2) of FIG. 4A and the diagram (b-2) of FIG. 4B, the middle edge ring 38m is moved upward by 1.0 mm.

[Contacting Structure of Middle Edge Ring]

With respect to the edge ring 38 having the above-described structure, the inner edge ring 38i and the outer edge ring 38o are fixed on the electrostatic chuck 36, with the inner edge ring 38i and the outer edge ring 38o contacted via the heat transfer sheet 39i and the heat transfer sheet 390 respectively. Thus, the inner edge ring 38i and the outer edge ring 38o, which are immovable members, are thermally and electrically stable.

Conversely, as the middle edge ring 38m can be moved vertically, the middle edge ring 38m may become thermally and electrically unstable, and controllability of temperature of the middle edge ring 38m may deteriorate. When the controllability of temperature of the middle edge ring 38m deteriorates, especially in a deposition process, control of an edge portion of a wafer W becomes difficult. Thus, process characteristics among wafers W in a production lot vary, and productivity decreases. In the following description, a technique for making the middle edge ring 38m thermally and electrically stable will be described.

Example 1

First, a structure of an edge ring 38 according to Example 1 of the present embodiment will be described with reference to FIGS. 5A and 5B. The edge ring 38 of Example 1 includes a contacting member 37a disposed between the the inner edge ring 38i and the middle edge ring 38m, and a contacting member 37b disposed between the middle edge ring 38m and the outer edge ring 38o.

The contacting member 37a is disposed between a horizontal surface of the inner edge ring 38i and a horizontal surface of the middle edge ring 38m. The contacting member 37b is disposed between a horizontal surface of the middle edge ring 38m and a horizontal surface of the outer edge ring 38o.

A cross section of the edge ring 38 taken along a line I-I in FIG. 3B is illustrated in FIG. 5A. A diagram (a-1) of FIG. 5A illustrates a state of the edge ring 38 in which the middle edge ring 38m is not raised by the lift pin 102 (Down (0 mm) state). A diagram (a-2) of FIG. 5A illustrates a state of the edge ring 38 in which the middle edge ring 38m is raised by the lift pin 102, that is, an Up state (1 mm up, for example).

A cross section of the edge ring 38 taken along a line II-II in FIG. 3B is illustrated in FIG. 5B. A diagram (b-1) of FIG. 5B illustrates a state of the edge ring 38 in which the middle edge ring 38m is not raised by the lift pin 102, that is, a Down state. A diagram (b-2) of FIG. 5B illustrates a state of the edge ring 38 in which the middle edge ring 38m is raised by the lift pin 102, that is, an Up state. The actuation mechanism 200 can raise the middle edge ring 38m at a resolution of 0.006 mm.

When the middle edge ring 38m is in the Down state, in which the middle edge ring 38m is not raised by the lift pin 102 as illustrated in the diagram (a-1) of FIG. 5A and the diagram (b-1) of FIG. 5B, the contacting member 37a is pressed between the horizontal surfaces of the inner edge ring 38i and the middle edge ring 38m, and is deformed. Accordingly, contacting area of the contacting member 37a with the inner edge ring 38i and the middle edge ring 38m is enlarged, and thermal contact and electrical contact of the middle edge ring 38m becomes larger.

Conversely, as the contacting member 37b is not strongly pressed between the horizontal surfaces of the middle edge ring 38m and the outer edge ring 38o, a degree of deformation of the contacting member 37b is small (note that, in the following description, deformation of the contacting member 37a or 37b may be referred to as "displacement", and a degree of deformation of the contacting member 37a or 37b may be referred to as a "displacement amount"). However, because the contacting member 37b is interposed between the middle edge ring 38m and the outer edge ring 38o, thermal contact and electrical contact between the middle edge ring 38m and the electrostatic chuck 36 via the outer edge ring 38o is stably secured.

When the middle edge ring 38*m* is in the Up state, in which the middle edge ring 38*m* is raised by the lift pin 102 as illustrated in the diagram (a-2) of FIG. 5A and the diagram (b-2) of FIG. 5B, the contacting member 37*b* is pressed between the horizontal surfaces of the middle edge ring 38*m* and the outer edge ring 38*o*, and is deformed. Accordingly, contacting area of the contacting member 37*b* with the middle edge ring 38*m* and the outer edge ring 38*o* is enlarged, and thermal contact and electrical contact of the middle edge ring 38*m* becomes larger.

Conversely, as the contacting member 37*a* is not strongly pressed between the horizontal surfaces of the inner edge ring 38*i* and the middle edge ring 38*m*, a degree of deformation of the contacting member 37*a* is small. However, because the contacting member 37*a* is interposed between the inner edge ring 38*i* and the middle edge ring 38*m*, thermal contact and electrical contact between the middle edge ring 38*m* and the electrostatic chuck 36 via the inner edge ring 38*i* is stably secured.

In Example 1, because the contacting member 37*a* and the contacting member 37*b* are arranged in a circumferential direction over an entire circumference of the middle edge ring 38*m*, the movable middle edge ring 38*m* can be caused to be in stable thermal and electrical contact with the inner edge ring 38*i* and the outer edge ring 38*o* stably. Accordingly, heat conductivity between the stage 12 (electrostatic chuck 36) and the middle edge ring 38*m* improves, and controllability of temperature of the edge ring 38 can be improved. As a result, excellent process control at an edge portion of a wafer W is realized, variance of process characteristics among wafers W in a production lot can be reduced, and productivity improves.

Further, although deflection would tend to occur at the tab 38*m*2, and the deflection would make it difficult to position the middle edge ring 38*m* at a desired position precisely, because the contacting members 37*a* and 37*b* can reduce the deflection occurring at the tab 38*m*2, positioning of the middle edge ring 38*m* can be performed more precisely.

Further, under a process condition in which large electrical power of high frequency is applied, abnormal discharge occurs if the middle edge ring 38*m* is electrically floating. By providing the contacting members 37*a* and 37*b*, the occurrence of abnormal discharge is suppressed, and breakage of the edge ring 38 can be reduced.

The contacting member 37*a* and the contacting member 37*b* may not necessarily be provided over an entire circumference of the middle edge ring 38*m*. However, in order that the middle edge ring 38*m* is caused to be in stable thermal and electrical contact with the stage 12 stably, it is preferable that the contacting member 37*a* and the contacting member 37*b* are arranged in the circumferential direction over the entire circumference of the middle edge ring 38*m*.

Note that the contacting member 37*a* in Example 1 is an example of a first spring provided between the inner edge ring 38*i* and the middle edge ring 38*m*. The contacting member 37*b* in Example 1 is an example of a second spring provided between the middle edge ring 38*m* and the outer edge ring 38*o*.

Example 2

Next, a structure of an edge ring 38 according to Example 2 of the present embodiment will be described with reference to FIGS. 6A and 6B. The edge ring 38 of Example 2 includes a contacting member 37*a* disposed between the stage 12 and the middle edge ring 38*m*, and a contacting member 37*b* disposed between the middle edge ring 38*m* and the outer edge ring 38*o*.

The contacting member 37*a* is disposed between a horizontal surface of the stage 12 (electrostatic chuck 36) and a horizontal surface of the middle edge ring 38*m*. The contacting member 37*b* is disposed between a horizontal surface of the middle edge ring 38*m* and a horizontal surface of the outer edge ring 38*o*.

Figure 6A:
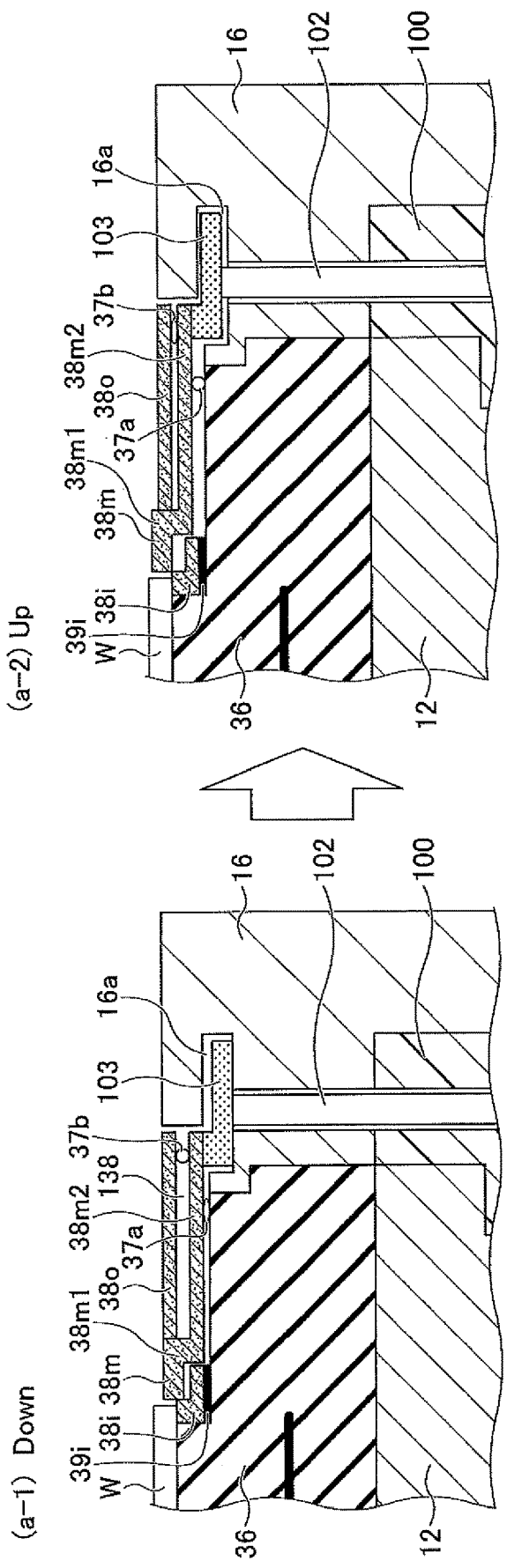
FIGS. 6A and 6B are diagrams illustrating contacting members of an edge ring according to Example 2.

A cross section of the edge ring 38 taken along the line I-I in FIG. 3B is illustrated in FIG. 6A. A diagram (a-1) of FIG. 6A illustrates a state of the edge ring 38 in which the middle edge ring 38*m* is not raised by the lift pin 102 (Down (0 mm) state). A diagram (a-2) of FIG. 6A illustrates a state of the edge ring 38 in which the middle edge ring 38*m* is raised by the lift pin 102, that is, an Up state (1 mm up, for example).

Figure 6B:
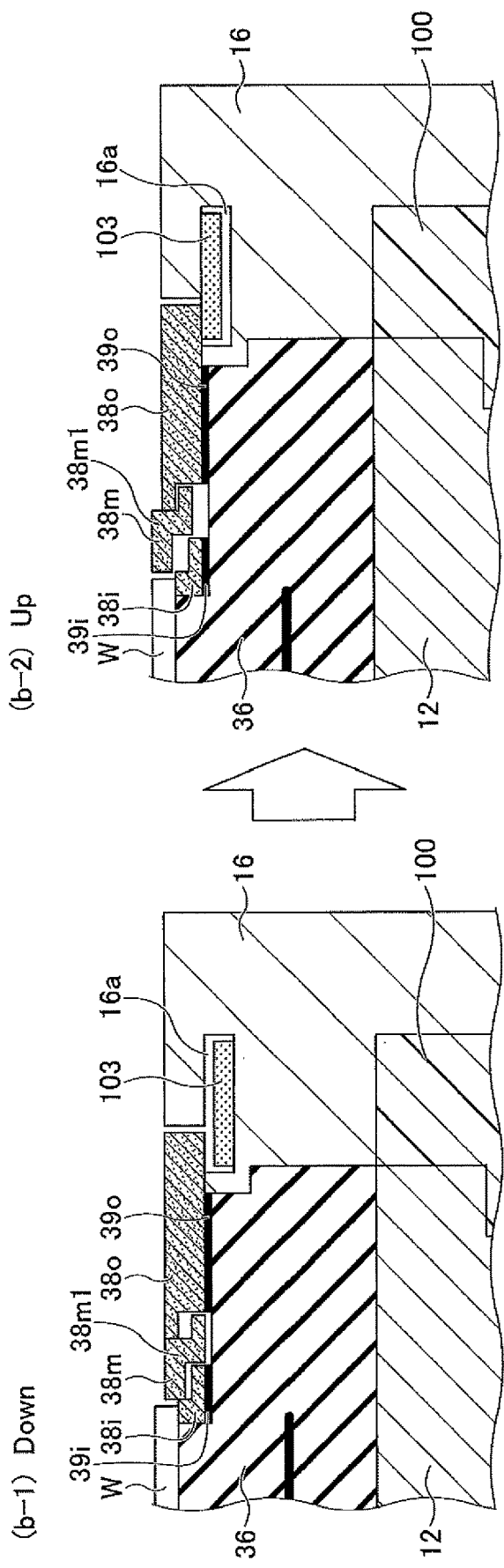

A cross section of the edge ring 38 taken along the line II-II in FIG. 3B is illustrated in FIG. 6B. A diagram (b-1) of FIG. 6B illustrates a state of the edge ring 38 in which the middle edge ring 38*m* is not raised by the lift pin 102, that is, a Down state. A diagram (b-2) of FIG. 6B illustrates a state of the edge ring 38 in which the middle edge ring 38*m* is raised by the lift pin 102, that is, an Up state.

When the middle edge ring 38*m* is in the Down state, in which the middle edge ring 38*m* is not raised by the lift pin 102 as illustrated in the diagram (a-1) of FIG. 6A and the diagram (b-1) of FIG. 6B, the contacting member 37*a* is pressed between the horizontal surfaces of the electrostatic chuck 36 (stage 12) and the middle edge ring 38*m*, and is deformed. Accordingly, contacting area of the contacting member 37*a* with the electrostatic chuck 36 (stage 12) and the middle edge ring 38*m* is enlarged, and thermal contact and electrical contact of the middle edge ring 38*m* becomes larger.

Conversely, as the contacting member 37*b* is not strongly pressed between the horizontal surfaces of the middle edge ring 38*m* and the outer edge ring 38*o*, a degree of deformation of the contacting member 37*b* is small. However, because the contacting member 37*b* is interposed between the middle edge ring 38*m* and the outer edge ring 38*o*, thermal contact and electrical contact between the middle edge ring 38*m* and the electrostatic chuck 36 via the outer edge ring 38*o* is stably secured.

When the middle edge ring 38*m* is in the Up state, in which the middle edge ring 38*m* is raised by the lift pin 102 as illustrated in the diagram (a-2) of FIG. 6A and the diagram (b-2) of FIG. 6B, the contacting member 37*b* is pressed between the horizontal surfaces of the middle edge ring 38*m* and the outer edge ring 38*o*, and is deformed. Accordingly, contacting area of the contacting member 37*b* with the middle edge ring 38*m* and the outer edge ring 38*o* is enlarged, and thermal contact and electrical contact of the middle edge ring 38*m* becomes larger.

Conversely, as the contacting member 37*a* is not strongly pressed between the horizontal surfaces of the electrostatic chuck 36 (stage 12) and the middle edge ring 38*m*, a degree of deformation of the contacting member 37*a* is small. However, because the contacting member 37*a* is interposed between the electrostatic chuck 36 (stage 12) and the middle edge ring 38*m*, thermal contact and electrical contact between the stage 12 (electrostatic chuck 36) and the middle edge ring 38*m* is stably secured.

As described above, in Example 2, because the contacting member 37*a* and the contacting member 37*b* are disposed at the middle edge ring 38*m* (specifically, at the tabs 38*m*2), the movable middle edge ring 38*m* can be caused to be in stable thermal and electrical contact with the stage 12 (electrostatic chuck 36) via the inner edge ring 38*i* and the outer edge ring 38*o*. Accordingly, controllability of temperature of the edge ring 38 can be improved, and excellent process control at an edge portion of a wafer W is realized. As a result, variance of process characteristics among wafers W in a production lot can be reduced, and productivity improves.

In addition, in Example 2, thermal contact and electrical contact between the stage 12 and the middle edge ring 38*m* are secured by the contacting members 37*a* and 37*b*. Thus, occurrence of abnormal discharge, caused by an electrically floating middle edge ring 38*m* under a process condition in which large electrical power of high frequency is applied, is suppressed, and breakage of the edge ring 38 can be reduced.

In Example 2, each of a plural number of contacting members 37*a* and of contacting members 37*b* are arranged at the middle edge ring 38*m* along a circumferential direction. Specifically, the contacting members 37*a* and the contacting members 37*b* are disposed at the three tabs 38*m*2 provided on the outer circumference of the middle edge ring 38*m*. Note that the contacting member 37*a* in Example 2 is an example of a first spring provided between the stage 12 and the middle edge ring 38*m*. The contacting member 37*b* in Example 2 is an example of a second spring provided between the middle edge ring 38*m* and the outer edge ring 38*o*.

[Characteristics of Contacting Member]

The contacting members 37*a* and 37*b* according to Examples 1 and 2 illustrated in FIGS. 5A to 6B may have the following characteristics. First, the contacting members 37*a* and 37*b* according to Examples 1 and 2 are preferably coil-shaped elastic members. The contacting members 37*a* and 37*b* are preferably canted coils. For example, the contacting members 37*a* and 37*b* may be canted coil springs in which a wire is obliquely wound. The contacting members 37*a* and 37*b* may be coils arranged in a circumferential direction in a canted state. The contacting members 37*a* and 37*b* are preferably arranged in the circumferential direction over an entire circumference. The contacting members 37*a* and 37*b* may be made from beryllium copper (BeCu), tungsten (W), or tantalum (Ta).

According to the configuration, the movable middle edge ring 38*m* can be in stable thermal and electrical contact with the stage 12, by avoiding the middle edge ring 38*m* becoming in a thermally and electrically floating state. Thus, temperature control of the entire edge ring 38 is improved, and occurrence of abnormal discharge can be prevented.

In Examples 1 and 2, a case in which the contacting members 37*a* and 37*b* are disposed on the horizontal surface of the middle edge ring 38*m* is described, but a place in which the contacting members 37*a* and 37*b* are disposed is not limited to the horizontal surface of the middle edge ring 38*m*. For example, a recess may be formed on a side wall (vertical surface) of the recess 138 of the outer edge ring 38*o* where the tab 38*m*2 is inserted, and the contacting member 37*b* may be embedded on the recess on the side wall. In this case, the contacting member 37*b* is disposed between a vertical surface of the middle edge ring 38*m* and a vertical surface of the outer edge ring 38*o*. In this configuration, thermal and electrical contact between the middle edge ring 38*m* and the outer edge ring 38*o* can also be stably maintained.

It is preferable that an elastic member, in which a variation of restoring force of the elastic member with respect to a displacement of the elastic member is small, is used as the contacting members 37*a* and 37*b*, rather than an elastic member in which a variation of restoring force of the elastic member with respect to a displacement of the elastic member is large. In other words, an elastic member to be used as the contacting members 37*a* and 37*b* may have a characteristic that a ratio of a range of a displacement of the elastic member with respect to a predetermined range of force applied to the elastic member to a maximum amount of displacement of the elastic member is greater than or equal to a specific value (specific ratio).

Figure 7A:
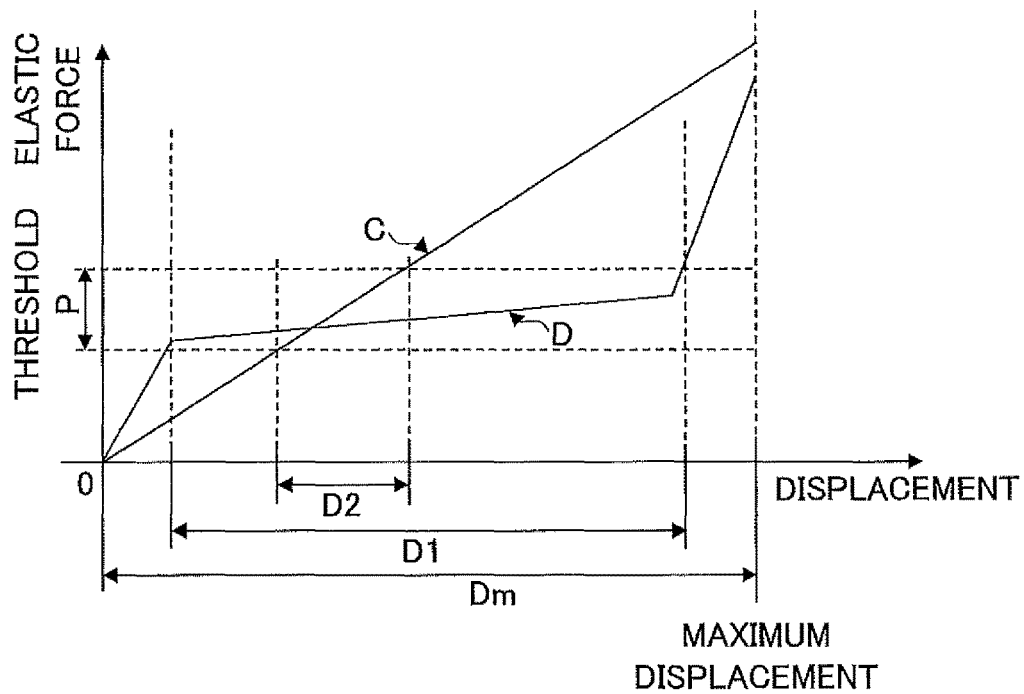
FIGS. 7A and 7B are graphs each illustrating a load characteristic of springs.
Figure 7B:
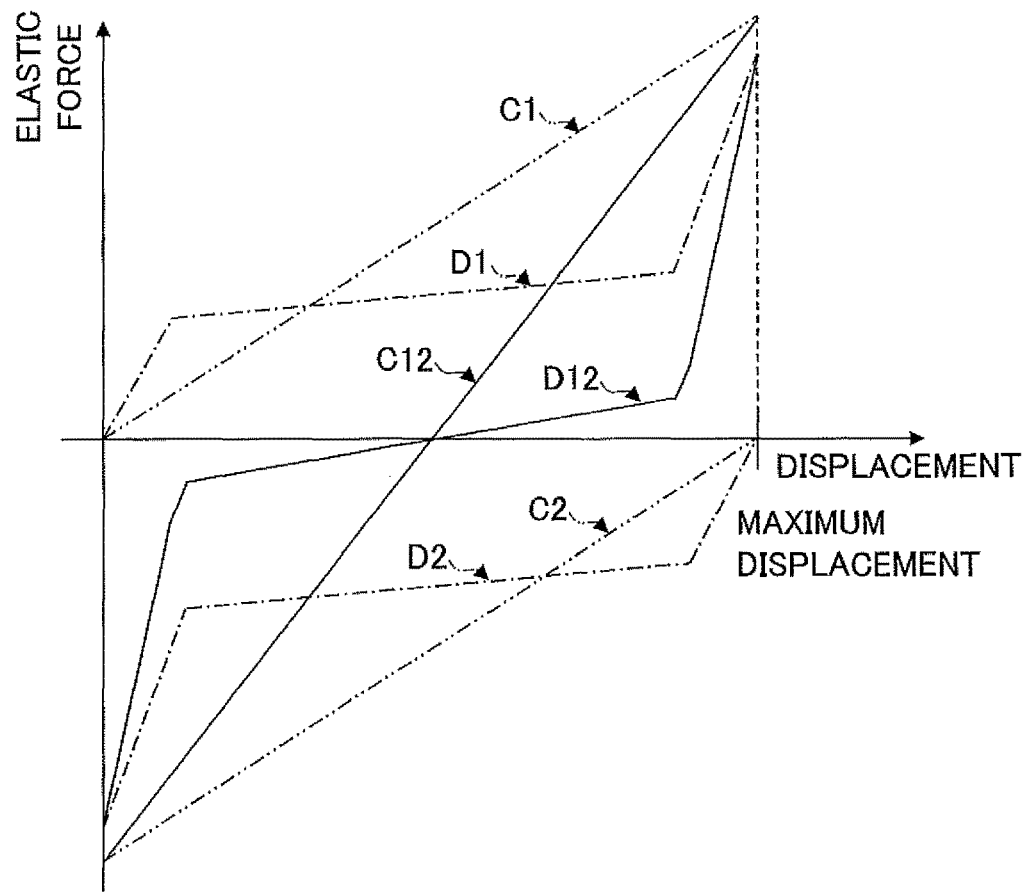

FIGS. 7A and 7B are graphs each illustrating a load characteristic of springs. Horizontal axes of the graphs indicate displacement of springs, and vertical axes indicate restoring force of springs (=load applied to springs). A spring C is an example of an elastic member having a wide range of displacement in which a variation of restoring force of the elastic member with respect to a displacement of the elastic member is large. A spring D is an example of an elastic member having a wide range of displacement in which a variation of restoring force of the elastic member with respect to a displacement of the elastic member is small.

For example, as illustrated in FIG. 7A, suppose a case in which a maximum amount of displacement is Dm, and in which the aforementioned predetermined range of force applied to the elastic member is P (threshold P). In a case in which the aforementioned specific value (ratio) is 0.7, with respect to the spring C, a ratio of a range of a displacement (D2) with respect to the predetermined range of force (P) to the maximum amount of displacement (Dm) is smaller than the specific value (0.7). Therefore, because a variation of restoring force of the spring C with respect to a displacement of the spring C is large, the characteristic of the spring C is not suitable for the contacting members 37*a* and 37*b*.

Conversely, with respect to the spring D, a ratio of a range of a displacement (D1) with respect to the predetermined range of force (P) to the maximum amount of displacement (Dm) is greater than or equal to the specific value (0.7). Therefore, because a variation of restoring force of the spring D with respect to a displacement of the spring D is small, the characteristic of the spring D is suitable for the contacting members 37*a* and 37*b*.

In a case in which a motor or the like for driving the actuation mechanism 200 is actuated, it is preferable that restoring force of the contacting members 37*a* and 37*b* is small. If the restoring force of the contacting members 37*a* and 37*b* is large, it is difficult for the motor to perform actuation smoothly.

A curve D12 in FIG. 7B represents a characteristic of a combination of springs D1 and D2 each having the same characteristics as the spring D. That is, the curve D12 represents a case in which the springs D1 and D2 are used as the contacting members 37*a* and 37*b* respectively. In the following, the combination of the springs D1 and D2 will be referred to as a "spring D12".

A curve C12 in FIG. 7B represents a characteristic of a combination of springs C1 and C2 each having the same characteristics as the spring C. That is, the curve C12 represents a case in which the springs C1 and C2 are used as the contacting members 37*a* and 37*b* respectively. In the following, the combination of the springs C1 and C2 will be referred to as a "spring C12".

The spring D12 has a wide range of displacement relative to a maximum displacement of the spring D12, in which a variation of restoring force of the spring D12 with respect to a displacement of the spring D12 is small. Accordingly, by using the spring D12, load applied to the edge ring 38 can be reduced. For example, within a predetermined range of displacement derived from the characteristic of the spring D12, restoring force of the spring D12 becomes almost constant. Because of the characteristic of the spring D12, if the springs D1 and D2 are used as the contacting members 37a and 37b respectively, as the contacting members 37a and 37b generate constant restoring force even when the middle edge ring 38m is moved to any vertical position, the actuating unit for the actuation mechanism 200 such as the piezo actuator 101 or a motor can be driven stably. On the other hand, as the spring C12 generates large restoring force, it is difficult to improve accuracy of vertical movement of the middle edge ring 38m.

Figure 8A:
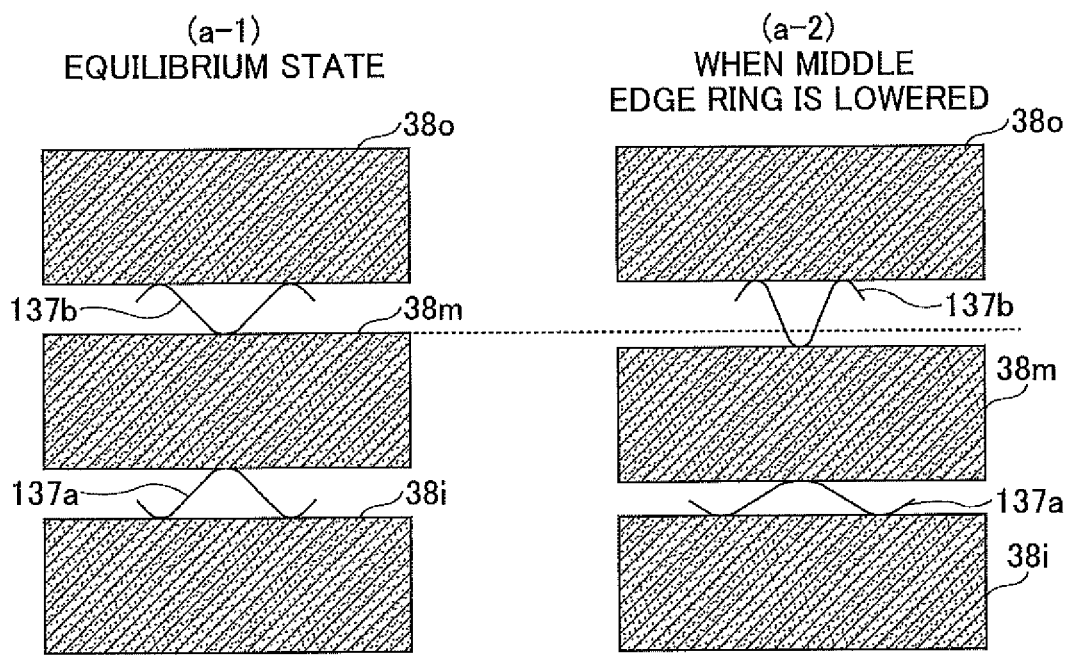
FIGS. 8A and 8B are diagrams for explaining contact resistance of the contacting member according to the embodiment.
Figure 8B:
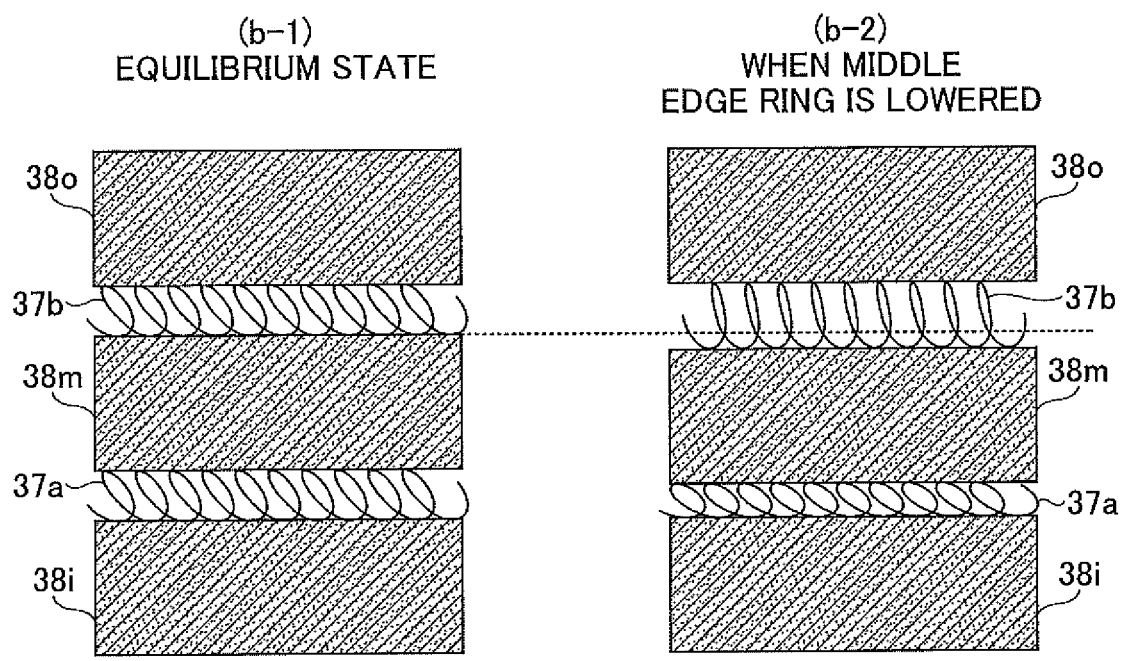

FIGS. 8A and 8B are diagrams for explaining contact resistance of the contacting members 37a and 37b according to the embodiment. FIG. 8A illustrates a comparative example, in which leaf springs 137a and 137b are used as the contacting members 37a and 37b respectively. FIG. 8B illustrates a case in which a canted coil spring is used as each of the contacting members 37a and 37b. Both FIG. 8A and FIG. 8B illustrate a case in which the contacting members 37a and 37b are in equilibrium, and a case in which the middle edge ring 38 is lowered.

A diagram (a-1) of FIG. 8A illustrates a case in which the leaf springs 137a and 137b according to the comparative example are interposed between the inner edge ring 38i and the middle edge ring 38m, and between the middle edge ring 38m and the outer edge ring 38o respectively, and in which the leaf springs 137a and 137b are in equilibrium.

When the middle edge ring 38m is lowered as illustrated in a diagram (a-2) of FIG. 8A, the leaf spring 137a is pressed from above, and an area of contact between the leaf spring 137a and the inner edge ring 38i and between the leaf spring 137a and the middle edge ring 38m increases. As a result, contact resistance (heat resistance) between the inner edge ring 38i and the middle edge ring 38m is reduced, and heat conductance improves. Contact between the middle edge ring 38m and the outer edge ring 38o is secured by the leaf spring 137b.

In a spring such as the leaf spring 137a or 137b having a wide range of displacement in which a variation of restoring force of the spring with respect to its displacement is large, load variance applied to an actuating unit such as a motor becomes large. Thus, it is difficult for the actuating unit to actuate smoothly.

In the present embodiment, a spring having a wide range of displacement in which a variation of restoring force of the spring with respect to its displacement is small is used as the contacting members 37a and 37b. For example, as illustrated in FIG. 8B, a canted coil spring is used as the contacting members 37a and 37b. A diagram (b-1) of FIG. 8B illustrates a case in which the contacting members 37a and 37b are interposed between the inner edge ring 38i and the middle edge ring 38m, and between the middle edge ring 38m and the outer edge ring 38o respectively, and in which the contacting members 37a and 37b are in equilibrium.

When the middle edge ring 38m is lowered as illustrated in a diagram (b-2) of FIG. 8B, the contacting member 37a of a canted coil spring is pressed from above, and an area of contact between the contacting member 37a and the inner edge ring 38i and between the contacting member 37a and the middle edge ring 38m increases. As a result, contact resistance (heat resistance) between the inner edge ring 38i and the middle edge ring 38m is reduced, and heat conductance improves. Contact between the middle edge ring 38m and the outer edge ring 38o is secured by the contacting member 37b.

In a canted coil spring used as the contacting member 37a or 37b having a wide range of displacement in which a variation of restoring force of the spring with respect to its displacement is small, load variance applied to an actuating unit such as a motor is small. Thus, actuation of the actuating unit can be performed smoothly.

That is, as illustrated in FIG. 7B, because contacting pressure of the contacting members 37a and 37b formed of canted coil springs according to the present embodiment do not largely vary when a range of displacement (degree of deformation) of the contacting members 37a and 37b is within an appropriate range, variation of heat resistance is small. Thus, the movable middle edge ring 38m can be caused to stably contact the stage 12 thermally and electrically, via the immovable inner edge ring 38i and the immovable outer edge ring 38o.

In the above description, a leaf spring is introduced as an example of a spring having a wide range of displacement in which a variation of restoring force of the spring with respect to its displacement is large. However, a leaf spring having a wide range of displacement in which a variation of restoring force of the spring with respect to its displacement is small is not included. Also, a spring having a wide range of displacement in which a variation of restoring force of the spring with respect to its displacement is small is not limited to a canted coil spring. An elastic member, having a characteristic that a ratio of a range of a displacement of the elastic member with respect to a predetermined range of force (load) applied to the elastic member to a maximum amount of displacement of the elastic member is greater than or equal to a specific value, can be used as the contacting members 37a and 37b according to the present embodiment.

As described above, in the substrate processing apparatus 5 according to the present embodiment, the movable middle edge ring 38m can be caused to stably contact the stage 12 thermally and electrically. Accordingly, controllability of temperature of the edge ring 38 improves, and excellent process control at an edge portion of a wafer W is realized. As a result, variance of process characteristics among wafers W in a production lot can be reduced, and productivity improves.

Further, because the middle edge ring 38m is stably in contact with the stage 12 thermally and electrically, occurrence of abnormal discharge can be suppressed, and breakage of the edge ring 38 can be reduced.

The substrate processing apparatus according to the embodiment described above should be understood to be exemplary and not to be restrictive. Various changes or enhancements to the aforementioned embodiment can be made without departing from the spirit and scope of the claims. Matters described in the above embodiment may be changed to other configurations, and may be combined unless inconsistency occurs.

The substrate processing apparatus according to the present disclosure can be applicable to any type of substrate processing apparatus, such as a capacitively coupled plasma (CCP) type, an inductively coupled plasma (ICP) type, a radial line slot antenna type, an electron cyclotron resonance plasma (ECR) type, and a helicon wave plasma (HWP) type.

In this specification, a wafer W is referred to as an example of a substrate. However, the substrate is not limited to the wafer. Examples of the substrate may include various types of substrates used in an LCD (Liquid Crystal Display) or a FPD (Flat Panel Display), a CD substrate, or a printed circuit board.

What is claimed is:
1. A substrate processing apparatus comprising:
a processing chamber;
a stage provided in the processing chamber;

an inner edge ring provided in a vicinity of a substrate that is to be placed on the stage;

a middle edge ring arranged outside the inner edge ring, the middle edge ring being configured to be moved vertically by a lift pin;

an outer edge ring arranged outside the middle edge ring;

a first spring provided between the inner edge ring and the middle edge ring; and a second spring provided between the middle edge ring and the outer edge ring, wherein the first spring is kept in contact with both the inner edge ring and the middle edge ring over an entire range of vertical movement of the middle edge ring, and the second spring is kept in contact with both the middle edge ring and the outer edge ring over the entire range of vertical movement of the middle edge ring.

2. The substrate processing apparatus according to claim 1, wherein the first spring is provided between a horizontal surface of the inner edge ring and a horizontal surface of the middle edge ring; and the second spring is provided between a horizontal surface of the middle edge ring and a horizontal surface of the outer edge ring.

3. The substrate processing apparatus according to claim 1, wherein the first spring and the second spring are arranged in a circumferential direction over an entire circumference.

4. The substrate processing apparatus according to claim 1, wherein each of the first spring and the second spring is formed of an elastic member having a characteristic that a ratio of a range of a displacement of the elastic member with respect to a predetermined range of force applied to the elastic member to a maximum amount of displacement of the elastic member is greater than or equal to a specific value.

5. The substrate processing apparatus according to claim 1, wherein the first spring and the second spring are coil springs.

6. The substrate processing apparatus according to claim 1, wherein the first spring and the second spring are arranged in a canted state.

7. The substrate processing apparatus according to claim 1, wherein the first spring and the second spring are made from beryllium copper (BeCu), tungsten (W), or tantalum (Ta).

8. The substrate processing apparatus according to claim 1, further comprising a microcomputer configured to control the lift pin to move the middle edge ring by an amount in accordance with amount of abrasion of the middle edge ring, or by an amount in accordance with a process condition.

9. The substrate processing apparatus according to claim 1, wherein the middle edge ring has a first horizontal surface facing downward and a second horizontal surface facing upward, the first spring being in contact with one of the first horizontal surface and the second horizontal surface, the second spring being in contact with another one of the first horizontal surface and the second horizontal surface.

10. The substrate processing apparatus according to claim 1, further comprising a cylindrical supporting member arranged outside the outer edge ring such that an upper surface of the outer edge ring is flush with an upper surface of the cylindrical supporting member.

11. The substrate processing apparatus according to claim 1, further comprising an electrostatic chuck, wherein the inner edge ring and the outer edge ring are fixed on an upper surface of the electrostatic chuck via a first heat transfer sheet and a second heat transfer sheet, respectively.

12. The substrate processing apparatus according to claim 1, wherein the outer edge ring has a portion that overlaps an upper surface of a peripheral portion of the middle edge ring.

13. The substrate processing apparatus according to claim 1, further comprising:

a piezo actuator;

a member connected to the piezo actuator; and a bushing connecting the member and the lift pin, wherein the lift pin is moved vertically by a driving force of the piezo actuator via the member and the bushing.

14. A substrate processing apparatus comprising:

a processing chamber;

a stage provided in the processing chamber;

an inner edge ring provided in a vicinity of a substrate that is to be placed on the stage;

a middle edge ring arranged outside the inner edge ring, the middle edge ring being configured to be moved vertically by a lift pin;

an outer edge ring arranged outside the middle edge ring;

a first spring provided between the inner edge ring and the middle edge ring; and a second spring provided between the middle edge ring and the outer edge ring, wherein the middle edge ring includes a ring portion surrounding a periphery of the substrate, and a plurality of tabs arranged at an outer circumference of the ring portion at regular intervals; and the outer edge ring includes a plurality of recesses on a bottom surface of the outer edge ring, the recesses being located above the tabs, and being capable of storing the tabs respectively.

15. The substrate processing apparatus according to claim 14, comprising a plurality of said lift pins, wherein the plurality of tabs are three tabs arranged at regular intervals in a circumferential direction of the middle edge ring, and the plurality of said lift pins are three lift pins that are provided in one-to-one correspondence with the three tabs.

* * * * *